(12) United States Patent
Ballet et al.

(10) Patent No.: US 8,574,818 B2
(45) Date of Patent: Nov. 5, 2013

(54) METHOD FOR PREPARING A PHOTO-CROSSLINKABLE COMPOSITION

(75) Inventors: Jerome Ballet, Charenton-le-Pont (FR); Claudine Biver, Charenton-le-Pont (FR); Jean-Paul Cano, Charenton-le-Pont (FR); Florent Deliane, Montpellier Cedex (FR); Pascal Etienne, Montpellier Cedex (FR); Marjorie Llosa, Charenton-le-Pont (FR)

(73) Assignees: Essilor International (Compagnie Generale d'optique), Charenton-le-Pont (FR); Centre National de la Recherche Scientifique-CNRS, Paris Cedex (FR)

( * ) Notice: Subject to any disclaimer, the term of this patent is extended or adjusted under 35 U.S.C. 154(b) by 483 days.

(21) Appl. No.: 12/936,458

(22) PCT Filed: Apr. 9, 2009

(86) PCT No.: PCT/FR2009/050640
§ 371 (c)(1),
(2), (4) Date: Oct. 5, 2010

(87) PCT Pub. No.: WO2009/136093
PCT Pub. Date: Nov. 12, 2009

(65) Prior Publication Data
US 2011/0033802 A1 Feb. 10, 2011

(30) Foreign Application Priority Data

Apr. 11, 2008 (FR) ...................... 08 52452

(51) Int. Cl.
*G03F 7/004* (2006.01)
*G03F 7/30* (2006.01)
*G03F 7/38* (2006.01)

(52) U.S. Cl.
USPC .................. 430/280.1; 430/325; 430/330

(58) Field of Classification Search
None
See application file for complete search history.

(56) References Cited

U.S. PATENT DOCUMENTS

| 5,945,172 | A | 8/1999 | Yamaya |
| 6,069,259 | A | 5/2000 | Crivello |
| 2004/0017994 | A1 | 1/2004 | Kodama |
| 2004/0067450 | A1 | 4/2004 | Leatherdale |

FOREIGN PATENT DOCUMENTS

| EP | 1 795 550 | | 6/2007 |
| EP | 1 795 550 a1 | * | 6/2007 |

* cited by examiner

*Primary Examiner* — Cynthia Hamilton
(74) *Attorney, Agent, or Firm* — Occhiuti & Rohlicek LLP

(57) ABSTRACT

The invention relates to a photo-crosslinkable composition obtainable by a method comprising: (a) the hydrolysis and condensation reaction of a [(epoxycycloalkyl)alkyl]trialkoxysilane in solution in an organo-aqueous medium as described in specification to obtain a solution of an organo-mineral hybrid prepolymer, in which the totality or quasi-totality of the alkoxysilane groups has been hydrolysed, and which comprises in average at least 4 (epoxycycloalkyl)alkyl groups; (b) cooling the obtained polyepoxide prepolymer composition as described in specification: (c) adding to said composition at least one cationic-polymerisation photo-photoinitiator and at least one specific photosensitiser as describes in specification and adding a surfactant; (d) agitating the obtained composition as described in specification thus obtained; (e) filtering the obtained composition as described in specification thus obtained; and (f) storing the obtained liquid filtrate as described in specification thus obtained. The invention also relates to the a photocrosslinkable composition as a negative photosensitive resin in a photolithography process.

21 Claims, No Drawings

METHOD FOR PREPARING A PHOTO-CROSSLINKABLE COMPOSITION

CROSS-REFERENCE TO RELATED APPLICATION

This application is the National Stage of International Application No. PCT/FR2009050640, filed on Apr. 9, 2009, which claims the priority of French Patent Application No. 0852452, filed on Apr. 11, 2008. The contents of both applications are hereby incorporated by reference in their entirety.

The subject of the present invention is an epoxysilane-based photocrosslinkable composition, a method for preparing such a photocrosslinkable composition, and the use of such a composition for photolithography.

It is known practice, from French patent application FR 2 872 589, in the name of the applicant, to prepare a transparent optical component by forming, in a transparent polymer layer, on a support which is also transparent, a assembly of closed cells separated from one another and juxtaposed parallel to a surface of said optical component. Each cell is filled with a suitable optical material such that the assembly of the cells thus filled confers a desired optical function on the component. The optical function of the component may be, for example, an optical power (refractive index), sun protection (UV-light-absorbing component) or a reinforcement of contrast (polarizing component).

Such an optical component can be formed, for example, by photolithography which comprises depositing a transparent photosensitive composition on a support which is also transparent, exposing said photosensitive composition according to a pattern provided by a mask (photoresist), for example a rectangular or hexagonal grid pattern, to a light capable of triggering the polymerization and/or crosslinking of the composition in the exposed areas, then revealing the pattern by removing the noncrosslinked composition by means of a solvent.

In such a structure, the cured photocrosslinked areas then correspond to the walls separating the cells from one another.

These walls should not only be transparent, but should advantageously have a refractive index that is as close as possible to the other constitutive elements of the optical component, and in particular of the transparent support and/or of the material for filling the cells, in order to limit any optical perturbation. Such optical perturbations are in fact unacceptable in particular when the optical component is used as an element intended to protect or correct vision, such as an ophthalmic lens, for example.

The transparent material forming the walls which separate the cells of the optical component should also have good chemical resistance and mechanical strength in order to ensure the sealing between the cells.

The walls separating the cells are advantageously as thin as possible in order to provide maximum filling of the surface of the optical component with the optical material. Moreover, it will generally be sought to prepare walls which are not only as thin as possible, but also as high as possible. The height of the walls in fact directly determines the depth of the cells, in other words the thickness of the layer of optical material filling the cells. The height of the walls obviously depends directly on the thickness of the layer of photocurable resin deposited on the transparent support.

It is thus possible to define an "aspect ratio" equal to the wall height/thickness ratio. This ratio is preferably as large as possible, and values of greater than or equal to 4 or 5 are generally targeted.

The applicant has developed a novel photocrosslinkable composition, useable in a photolithography process, which makes it possible to obtain a completely transparent resin, having a refractive index close to that of the other transparent optical materials, exhibiting good solidity in the cured state, which is both sufficiently fluid to spread easily and evenly on the transparent support and sufficiently viscous to give the deposited layer a relatively large thickness.

This novel composition is characterized by a combination of an organomineral "hybrid" prepolymer having a silica backbone and organic side functions, of a cationic polymerization photoinitiator and of a photosensitizer.

The prepolymer is synthesized from a monomer, an [(epoxycycloalkyl)alkyl]trialkoxysilane, having three alkoxy functions which, by hydrolysis and polycondensation under conditions which leave all or some of the epoxide functions intact, result in a three-dimensional mineral network of silica type. This dense mineral network gives the completely crosslinked resin the necessary hardness and good chemical resistance.

The choice of this family of compounds is directly related to the use that the applicant wishes to make of the photocrosslinkable composition. These compounds exhibit polymerization kinetics which make them particularly suitable for the photolithography process of the present invention, in particular in the radiation step which can, through the choice of these monomers, be carried out under optimum time and temperature conditions resulting in the desired thermoset material. These compounds are characterized in particular in that the epoxy group located on the cycloalkyl group shows sufficient resistance to acid hydrolysis under the conditions used in step (a) of the process (pH of between 1.6 and 4, temperature 50-70° C.) while at the same time exhibiting advantageous reactivity at the time of the photocrosslinking of the composition containing the prepolymer. The prepolymers prepared in the present invention are thus more reactive than those prepared from 3-glycidyloxypropyltrimethoxysilane (Glymo) where the epoxy group is carried, not by a cycloalkyl group, but by a linear alkyl chain. This higher reactivity makes it possible not only to advantageously shorten the photocrosslinking step (which takes only a few seconds), but makes it possible, unlike 3-glycidyloxypropyltrimethoxysilane, to obtain the desired aspect ratios of greater than 4.

The method for preparing the photocrosslinkable composition of the present invention is carried out in such a way that virtually all, or even all, of the alkoxysilane functions of the monomer are hydrolyzed, but only some of the resulting silanol functions are condensed. This partial condensation results in a mixture of oligomers comprising very few residual alkoxysilane functions (less than 5%) and a large number of epoxide functions which will react only during the photocrosslinking step initiated by a suitable form of radiation. The method of the present invention is in fact designed in such a way that at most 20% to 30% of the initial epoxide functions are hydrolyzed and that the prepolymer still comprises at least approximately 70% of the epoxy groups present at the start on the monomers.

Patent application U.S. 2004/0017994 describes the use of epoxyalkyltriorganoxysilanes, such as 2-(3,4-epoxycyclohexylethyl)trimethoxysilane and 3-glycidoxypropyltriethoxysilane (Glymo), for preparing waveguides by photocuring prepolymer compositions. The method described in this document comprises a step of acid hydrolysis of an aqueous-alcoholic solution of the monomer at low temperature (0-50° C.), followed by a condensation reaction at a high temperature, i.e. a temperature above the boiling point of the solvent.

The prepolymers obtained under these conditions comprise very few epoxide groups. This is because approximately 90% of the epoxide functions initially present on the monomers are hydrolyzed during the method (see the formulae of the organopolysiloxanes obtained in examples 1-3). Such prepolymers comprising few epoxide groups require relatively long (several minutes) photocuring steps and do not make it possible to obtain high aspect ratios. The thickness of the layers cured in the presence of a mask (=height of the cured areas after removal of the noncured areas) is in fact less than 10 µm (see examples 1-3), whereas, for the application envisioned in the present invention, it is desirable to obtain heights of about a few tens of micrometers, for example from 10 to 50 µm, for relatively small widths, of about a few micrometers only.

Consequently, the subject of the invention is a method for preparing a photocrosslinkable composition comprising the following steps:
(a) a reaction for hydrolysis and condensation of an [(epoxycycloalkyl)alkyl]trialkoxysilane in solution in an organoaqueous medium containing water, in an initial water/monomer molar ratio of between 3 and 15, preferably between 8 and 12, and in particular between 9 and 11, and at least one water-miscible solvent, at a pH of between 1.6 and 4.0, preferably between 1.6 and 3.0, by heating the solution at a temperature of between 50 and 70° C. for a period of between 180 and 350 minutes, so as to obtain a solution of an organomineral hybrid prepolymer, in which all or virtually all of the alkoxysilane groups have been hydrolyzed, and which comprises on average at least 4 (epoxycycloalkyl)alkyl groups, preferably from 4 to 10 (epoxycycloalkyl)alkyl groups, per molecule,
(b) cooling the resulting polyepoxide prepolymer composition to a temperature of between 15 and 25° C.,
(c) adding to this composition at least one cationic polymerization photoinitiator and at least one photosensitizer having a maximum absorption at a wavelength of between 300 and 420 nm, and optionally adding a surfactant,
(d) stirring the resulting composition for a period of between 10 and 120 minutes, preferably between 20 and 40 minutes, at a temperature of between 15 and 25° C.,
(e) filtering the resulting composition through a filter comprising pores with an average size of between 1 and 5 µm, and
(f) storing the resulting liquid filtrate at a temperature below 0° C., preferably between −20° C. and −10° C.

The subject of the present invention is also the photocrosslinkable compositions which can be obtained by means of such a method or by means of a variant thereof.

Finally, the subject of the invention is the use of such a composition in a photolithography process and a photolithography process using such a composition.

The monomer used for the synthesis of the photocrosslinkable polyepoxide prepolymer is an [(epoxycycloalkyl)alkyl] trialkoxysilane in which the two carbon atoms of the epoxy function are part of the cycloalkyl group. The cycloalkyl group is preferably a $C_{4-8}$ cycloalkyl group, in particular a cyclohexyl group. The alkyl group carrying the epoxycloalkyl group is preferably a linear or branched $C_{1-6}$ alkyl group, in particular an ethyl group. Finally, the three alkoxy groups, directly linked to the silicon atom, are independently linear or branched $C_{1-6}$ alkoxy groups, preferably methoxy groups.

Consequently, the monomer is preferably an [(epoxy($C_{4-8}$ cycloalkyl))$C_{1-6}$ alkyl]tri($C_{1-6}$ alkoxy) silane, and in particular 2-(3,4-epoxycyclohexyl)ethyltrimethoxysilane of formula (I), sold, for example, by the company Shin Etsu under the name KBM 303.

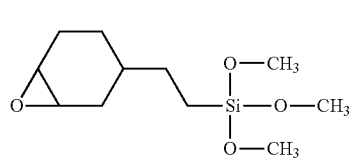

formula (I)

The [(epoxycycloalkyl)alkyl]trialkoxysilane is preferably used in a proportion of from 25% to 60% by weight, preferably from 30% to 45% by weight, relative to the total weight of the initial reaction mixture containing the monomer, the water, the solvent and the acid.

The monomer is insoluble in pure water and it is, consequently, necessary to solubilize it by adding at least one water-miscible organic solvent. It is, in principle, possible to use any relatively polar, preferably nontoxic, organic solvent which is inert with respect to the components of the reaction medium and which makes it possible to prepare a homogeneous reaction medium in which the monomer is completely dissolved. The applicant has obtained good results with methanol and ethanol. Ethanol will preferably be used.

The amount of solvent necessary to completely dissolve the epoxysilane depends, of course, on the precise chemical nature of the monomer and of the solvent, and those skilled in the art will be able to determine without difficulty the appropriate solvent/water/monomer ratio so as to be under homogeneous hydrolysis conditions.

The pH of the initial reaction medium is adjusted by adding an inorganic acid, such as hydrochloric acid, preferably to a value of less than 3.

In step (a) of the method, the alkoxysilane groups undergo an acid hydrolysis, and then the hydroxyl groups formed react with one another, with the departure of one molecule of water, which results in the formation of Si—O—Si chains in the three spatial dimensions. This type of reaction is known and commonly used in sol-gel processes. Step (a) of the method of the present invention is carried out in such a way as to limit the polymerization of the silica-type network at the "sol" stage, the gelling and the curing of a three-dimensional network taking place only during the photolithography process. Any possible particles formed during step (a) will be removed from the composition according to the invention by the filtering step (e).

In view of the above, it will be understood that it is important to limit as much as possible the formation of solid particles, while at the same time allowing the polycondensation of the monomer, via the alkoxysilane groups, to go sufficiently far to obtain a composition having a suitable viscosity.

The reaction of step (a) is preferably carried out at a temperature of between 50 and 70° C., preferably between and 62° C., for a period of between 180 and 350 minutes, preferably between 200 and 320 minutes, with moderate stirring.

After reaction step (a) of the method of the present invention, the reaction mixture is cooled to room temperature, and then the system for photoinitiating the polymerization of the epoxide groups and, optionally, a surfactant are added thereto.

The applicant has obtained good results using an fluorinated surfactant such as the product Fluorad FC-430 sold by the company 3M. This product contains approximately 95% to 99% of fluoroaliphatic esters. Another fluorinated surfactant that can be used in the present invention is the product FC4430 also sold by the company 3M.

The surfactant is preferably used in a proportion of from 0.1% to 0.5% by weight, preferably from 0.15% to 0.45% by weight, relative to the solids content of said crosslinkable composition. The surfactant makes it possible to improve the spreading of the resin on the support and to obtain a deposited layer free of defects.

The polymerization of the epoxide groups, during or after the exposure of the composition of the present invention to light, is a cationic ring-opening polymerization. The photoinitiator is consequently an initiator which, when it is subjected to radiation of a suitable wavelength, forms cations that are sufficiently stable to attack the epoxycycloalkyl groups of the monomer. Such photoinitiators for cationic polymerization are known. They are in particular onium salts, and mention may be made, by way of example, of iodonium salts and triarylsulfonium salts, in particular the arylsulfonium hexafluorophosphates sold by the company Lamberti S.p.a., such as Esacure 1064, and the iodonium hexafluorophosphates sold by the company Ciba, such as Irgacure 250. A mixture of propylene carbonate and (4-methylphenyl)[4-(2-methylpropyl)phenyl]iodonium hexafluorophosphate, sold, for example, by the company Ciba under the name Irgacure 250, will preferably be used.

The concentration of the photoinitiator in the final crosslinkable composition is between 0.2% and 8% by weight, preferably between 0.5% and 6% by weight, relative to the solids content of said crosslinkable composition.

The cationic-polymerization photoinitiator used in the present invention is combined with a photosensitizer. Photoinitiators for cationic polymerization in general absorb at wavelengths that are unsuitable for the wavelengths used in photolithography. The photosensitizer makes it possible to shift the absorption wavelength in order to adapt it to the equipment conventionally used in photolithography.

Such photosensitizers are known in the art. By way of examples, mention may be made of the family of thioxanthones and of acylphosphines; for the latter, mention may, for example, be made of the product from the company Ciba known under the name Irgacure 819. The applicant has obtained good results with a mixture of 2-isopropylthioxanthone and 4-isopropylthioxanthone, sold by the company Ciba under the name Darocure ITX.

The concentration of the photosensitizer in the final photocrosslinkable composition is preferably between 0.3% and 2% by weight, preferably between 0.5% and 1.8% by weight, relative to the solids content of said crosslinkable composition.

In order to prevent undesirable early photocrosslinking of the composition of the present invention, steps (c), (d), (e) and (f) of the above preparation method are carried out away from actinic light, for example in vessels that are opaque to actinic light and/or under inactinic light.

The photocrosslinkable compositions obtained by means of a process as described above are generally quite fluid, i.e. they have a viscosity, measured at 20° C. using an Anton Paar MCR 300 rheometer (CP50-2 measuring module with an imposed velocity gradient), of less than 50 centipoises, preferably between 8 and 18 centipoises. The viscosity is determined by extrapolation at an infinite shear rate by applying the Bingham model.

Such low viscosities do not always make it possible to obtain layers of photocrosslinkable composition having the desired thickness. This is because some coating methods, such as spin coating, subject the photocrosslinkable composition to high shear forces which result in layers that are too thin.

It may, consequently, be necessary to prepare photocrosslinkable compositions which are relatively more viscous, making it possible to obtain thicker deposits and to increase the aspect ratio of the walls formed.

Moreover, it may be advantageous, for the implementation of certain depositing methods, to have compositions containing certain particular solvents, instead or in addition to those used in the reaction step.

For this, in the preparation method as described above, a step of partial evaporation of the solvent phase and a step of adjustment of the viscosity by adding solvent are successively envisioned. These two steps are preferably inserted between reaction step (a) and the step of cooling to room temperature (step (b)), but it is also possible to envision inserting them between the latter step and the addition of the photoinitiating system.

In one particular embodiment of the present invention, the method for preparing the photocrosslinkable composition consequently also comprises, between step (a) and step (b), or between step (b) and step (c):

a step (a2) during which the composition is subjected to evaporation under reduced pressure, preferably to evaporation at a temperature of between 25° C. and 35° C., under a reduced pressure of between 20 and 45 mbar, until a solids content of between 40% and 95%, preferably between 60% and 80%, in particular between 73% and 78% by weight, is obtained, and a step (a3) of adding at least one organic solvent chosen from 1-methoxy-2-propanol, N-methylpyrrolidone (NMP), propylene glycol methyl ether acetate (PG-MEA), acetone, ethanol and propylene glycol dimethyl ether, preferably 1-methoxy-2-propanol (Dowanol® PM), until a solids content of between 30% and 70% by weight, preferably between 50% and 65% by weight, and in particular between 55% and 62% by weight, is obtained.

The photocrosslinkable compositions obtained at the end of a method comprising these two additional steps generally have a viscosity, measured in the manner indicated above, of between 250 and 650 centipoises.

Controlling the viscosity of the composition and the nature of the solvent makes it possible to guarantee an even deposit of the photocrosslinkable composition on the transparent support, generally made of a synthetic polymer. If the thickness of the deposit is uniform, this in fact guarantees good resolution during the photolithography process over the entire surface to be treated.

It is also possible to replace the solvent and increase the viscosity of the photocrosslinking composition by subjecting the reaction mixture to a vacuum evaporation phase and subsequently adding the desired solvent in the form of a solution with the photoinitiator, the photosensitizer and, optionally, the surfactant.

In this variant of the method of the present invention, steps (b), (c) and (d) are therefore replaced with the following steps (b2), (c2) and (d2):

(b2) evaporating the solvent phase of the reaction mixture of step (a) for 120 to 300 minutes, under a reduced pressure of between 20 and 30 mbar, at a temperature of between 45° C. and 65° C., until a solids content of between 60% and 85%, in particular between 73% and 78% by weight, is obtained, (c2) preparing, at room temperature and with stirring, a homogeneous solution of at least one photoinitiator, at least one photosensitizer and, optionally, at least one surfactant, in a solvent chosen from 1-methoxy-2-propanol, N-methylpyrrolidone (NMP), propylene glycol methyl ether acetate (PGMEA), acetone, ethanol and propylene glycol dimethyl ether, preferably 1-methoxy-2-propanol;

(d2) mixing, at room temperature, the concentrated composition obtained in step (b2) with the homogeneous solution obtained in step (c2) by stirring for a period of between 30 and 60 minutes, the mixing ratio being such that the resulting composition has a solids content of between 40% and 70% by weight, preferably close to 60% by weight.

The photocrosslinkable compositions obtained at the end of this method of preparation also have a viscosity, measured in the manner indicated above, of between 250 and 650 centipoises.

As indicated above, the photocrosslinkable composition of the present invention can be used in a photolithography process for manufacturing transparent optical components as described in application FR 2 872 589. It is then used as a negative photosensitive resin, i.e., in the areas exposed to light, the composition polymerizes and crosslinks, resulting in the formation of a solid material, whereas, in the areas not exposed to light, the composition remains liquid and soluble and is removed during the revealing phase (washing with an appropriate solvent).

This photolithography technique requires, in a known manner, a two-dimensional mask (photoresist) which allows selective exposure of certain areas of the layer of photocrosslinkable composition of the present invention. For the preparation of optical components such as those described in FR 2 872 589, the areas exposed to light correspond to the future walls separating the cells, whereas the areas protected by the photoresist correspond to the surface occupied by the cells, or "vessels", which will subsequently be filled with the optical material.

For such an optical component comprising microvessels, it is possible to define a "filling factor" which corresponds to the proportion of the surface occupied by the cells, or vessels, relative to the total surface of the component. This filling factor is preferably at least equal to 95%, in particular at least equal to 98%. By way of example, a filling factor of 98% corresponds, for square vessels, to a wall width of 2 µm for a vessel width of 200 µm.

The photocrosslinkable composition of the present invention makes it possible, by virtue of its particular composition, to obtain microstructured transparent optical components as described in FR 2 872 589, comprising in particular optical lenses, such as ophthalmic lenses, and windows such as window panes for buildings and windows for transportation vehicles, with high aspect ratios, greater than or equal to 5. In other words, the photolithography process described in greater detail hereinafter, using the photocrosslinkable resin of the present invention, makes it possible to produce walls having a height of between 10 and 50 µm, preferably between 15 and 50 µm, and a width, or thickness, of between 1 µm and 8 µm, preferably between 2 µm and 5 µm.

As indicated above, the subject of the present invention is also a photolithography process using the photocrosslinkable composition described above. This photolithography process comprises the following successive steps:

(i) coating a layer of a photocrosslinkable composition as described above onto a support, preferably a transparent support (coating step), (ii) exposing certain areas of the layer of photocrosslinkable composition to radiation which makes it possible to activate the photoinitiator and/or the photosensitizer and to trigger the cationic polymerization of the epoxycycloalkyl functions of the prepolymer present in said photocrosslinkable composition (irradiation step), and (iii) removing the nonphotocrosslinked areas by immersion of the support carrying the partially photocrosslinked composition in a solvent for the photocrosslinkable composition (revealing step).

The transparent support which receives the layer of photocrosslinkable composition is preferably made of plastic, i.e. of a synthetic polymer. By way of nonlimiting example, mention may be made of polyethylene terephthalate) (PET). The coating can be carried out by any suitable coating technique, such as dip coating, spray coating, bar coating or spin coating. Spin coating is in particular preferred.

The irradiation step is preferably carried out with light having emission lines which have a wavelength of between 240 and 420 nm, preferably with light from a mercury or xenon-mercury lamp having an emission line at 365 nm. The irradiation of the photocrosslinkable composition is preferably carried out with a dose of greater than or equal to 100 $mJ/cm^2$.

The solvent used, in the revealing step, to remove the noncrosslinked composition may be any solvent which is a good solvent for the noncrosslinked composition but leaves the crosslinked parts intact. By way of example, mention may be made of acetone or isopropanol, which will preferably be used at room temperature.

Preferably, and in a known manner, the coating, irradiation and revealing steps above are followed by bake steps.

Thus, step (i) is generally followed by a "soft bake" step, preferably at a temperature of between 40 and 100° C., for a period of between 2 and 30 minutes. This soft bake serves mainly to evaporate at least a part of the solvent.

Step (ii) of exposure to light is preferably followed by a "post-exposure bake" step, preferably at a temperature of between 20° C. and 85° C., in particular between 50° C. and 80° C., for a period of between 5 and 30 minutes. The function of this second bake is to promote the chain polymerization of the epoxy functions and the crosslinking of the photosensitive resin.

Finally, revealing step (iii) is followed by a "hard bake" step, preferably at a temperature of between 100° C. and 130° C., in particular between 110° C. and 125° C., for a period of between 30 and 180 minutes, preferably between 50 and 120 minutes. This step serves to complete the condensation of the silanol functions and the chain polymerization of the residual epoxy functions and gives the final resin its chemical resistance and mechanical strength.

These various steps of the photolithography process will be adjusted according to the geometry of the network of microstructures that it is desired to obtain, taking into account in particular the parameters of wall height and thickness and also the distance separating the walls from one another. The parameters of each step of the photolithography process will also be adapted to the equipment used. Such adaptations are well known to those skilled in the art.

EXAMPLE 1

Preparation of a Photocrosslinkable Composition 1804 g (7.3 mol) of 2-(3,4-epoxycyclohexyl)ethyltrimethoxysilane (EETMOS, molar mass 246 $g.mol^{-1}$) supplied by the company Shin Etsu and 557 g of absolute ethanol are introduced into a glass reactor with a capacity of 5 liters, fitted with a jacket and a stirring system. The solution is stirred at a rotational speed of 700 rpm. A preprepared mixture of 557 g of absolute ethanol and 1320 g of a 0.1 N aqueous solution of hydrochloric acid (approximately 73 mol of water) is then introduced, with stirring and over a period of 10 minutes, so as to obtain a reaction solution with a water/initial monomer molar ratio approximately equal to 10. The temperature inside the reactor is then brought to 60° C. The reaction medium is maintained at this temperature for a period of 5 hours and with stirring at 200 rpm. After 5 hours, the reaction medium is cooled to room temperature by circulating a cold fluid in the jacket of the reactor. This return to room temperature takes place over a period of 90 minutes. The amount of solution collected is 4220 g. The dry extract of said solution is 32.5% and its viscosity at 20° C. is equal to 9.78 cP. This solution no longer contains any nonhydrolyzed initial monomer.

A part of the solution thus obtained is concentrated under vacuum in a rotary evaporator. For this, 719.8 g of the solution are introduced into a 2-liter pear-shaped flask. This flask is installed on the rotary evaporator. The evaporation is carried out by immersing the flask in a bath thermostatted at a temperature of 30° C. and slowly rotating it. The pressure is gradually reduced to 25 mbar, taking care to control the boiling of the liquid. The evaporation is stopped after approximately 2 hours when the dry extract of the solution has reached a value of 73%. 312 g of this concentrated prepolymer solution are removed from the pear-shaped flask.

3.41 g of photosensitizer (Darocure ITX from the company Ciba) and 58.55 g of 1-methoxy-2-propanol (Dowanol PM) are subsequently introduced into a UV-opaque brown-colored bottle. The mixture is stirred for 5 minutes at 900 rpm in order to solubilize all the photosensitizer. 10.3 g of photoinitiator (Irgacure 250 from the company Ciba) and 0.82 g of fluorinated surfactant (FC430 from the company 3M) are subsequently introduced into this mixture. Stirring is again carried out for 5 minutes. 270 g of the concentrated solution obtained after evaporation, having a dry extract of 73%, are subsequently introduced into this mixture, with stirring. The addition is carried out in small portions in order to obtain a homogeneous mixture. When all of the concentrated prepolymer solution has been added, slow stirring is maintained for 30 minutes in order to prevent the formation of bubbles. The composition obtained is subsequently filtered through a Sartopure 300 PP2 filter with a porosity of 3 µm, using a peristaltic pump. The viscosity of the filtrate collected is 346 cP.

To finish, the composition is packaged in UV-opaque brown bottles, and then stored in a freezer at a temperature of −18° C.

EXAMPLE 2

Photolithography Process
    Spreading of the composition obtained in example 1 using
      a centrifugation machine with the following parameters:
      volume of composition deposited: 5 ml
      rotation speed: 1000 rpm
      acceleration: 1000 rpm/sec
      duration: 30 s.
    Soft bake for solvent evaporation:
      10 min at 50° C. in an oven.
    Insolation
      200 mJ/cm$^2$ at 365 nm in soft contact.
    Post bake:
      20 min at 80° C. in an oven.
    Development:
      dipping in isopropanol with stirring for 1 min and 30 sec,
      rinsing with acetone and deionized water.
    Hard bake:
      3 h at 110° C.

The process illustrated in example 2 makes it possible to obtain a network of microstructures comprising walls 20 µm in height and having a thickness of 3 µm.

The invention claimed is:

1. A method for preparing a photocrosslinkable composition, comprising the following steps:
   (a) hydrolysis and condensation of an [(epoxycycloalkyl)alkyl]trialkoxysilane in solution in an organoaqueous medium containing water, in a water/monomer initial molar ratio of between 3 and 15, and at least one water-miscible solvent, at a pH of between 1.6 and 4.0, by heating the solution at a temperature of between 50 and 70° C. for a period of between 180 and 350 minutes, so as to obtain a solution of an organomineral hybrid prepolymer, in which all or virtually all of the alkoxysilane groups have been hydrolyzed, and which comprises on average from 4 to 10 (epoxycycloalkyl)alkyl groups, per molecule,
   (b) cooling the resulting polyepoxide prepolymer composition to a temperature of between 15 and 25° C.,
   (c) adding to this composition at least one cationic polymerization photoinitiator and at least one photosensitizer having a maximum absorption at a wavelength of between 300 and 420 nm, and adding a surfactant,
   (d) stirring the resulting composition for a period of between 10 and 120 minutes, at a temperature of between 15 and 25° C.,
   (e) filtering the resulting composition through a filter comprising pores with an average size of between 1 µm and 5 µm, and
   (f) storing the resulting liquid filtrate at a temperature below 0° C. as the photocrosslinkable composition.

2. The preparation method as claimed in claim 1, wherein the [(epoxycycloalkyl)alkyl]trialkoxysilane is an [epoxy($C_{4-8}$cycloalkyl))$C_{1-6}$alkyl]tri($C_{1-6}$alkoxy)silane.

3. The preparation method as claimed in claim 1, wherein the concentration of [(epoxycycloalkyl)alkyl]trialkoxysilane in the reaction medium of step (a) is between 25% and 60% by weight.

4. The preparation method as claimed in claim 1, wherein the hydrolysis-condensation reaction of step (a) is carried out at a temperature of between 55 and 65° C. for a period of between 200 and 320 minutes.

5. The preparation method as claimed in claim 1, wherein the concentration of the surfactant in the photocrosslinkable composition is between 0.1% and 0.5% by weight, relative to the solids content of said photocrosslinkable composition.

6. The preparation method as claimed in claim 1, wherein the photosensitizer is selected from the group consisting of thioxanthones and acylphosphines.

7. The preparation method as claimed in claim 6, wherein the concentration of the photosensitizer in the photocrosslinkable composition is between 0.3% and 2% by weight relative to the solids content of said photocrosslinkable composition.

8. The preparation method as claimed claim 1, wherein the cationic polymerization photoinitiator is selected from the group consisting of iodonium salts triarylsulfonium salts, and arylsulfonium hexafluorophosphates.

9. The preparation method as claimed in claim 8, wherein the concentration of the photoinitiator in the photocrosslinkable composition is between 0.2% and 8.0% by weight relative to the solids content of said photocrosslinkable composition.

10. The preparation method as claimed in claim 1, wherein the solvent used in step (a) is chosen from ethanol and methanol.

11. The preparation method as claimed in claim 1, wherein the pH of the reaction medium is less than 3.

12. The preparation method as claimed in claim 1, further comprising, between step (a) and step (b), or between step (b) and step (c),
- a step (a2) during which the composition is subjected to evaporation under reduced pressure until a solidscontent of between 40% and 95% is obtained, and
- a step (a3) of adding at least one organic solvent selected from the group consisting of 1-methoxy-2-propanol, N-methylpyrrolidone (NMP), propylene glycol methyl ether acetate (PGMEA), acetone, ethanol and propylene glycol dimethyl ether, until a solids content of between 30% and 70% by weight, is obtained.

13. A photocrosslinkable composition obtainable by means of a method as claimed in claim 12, characterized in that it has a viscosity, measured at 20° C., of between 250 and 650 centipoises.

14. A photocrosslinkable composition obtainable by means of a method as claimed in claim 1.

15. A photolithography process, comprising:
(i) coating a layer of a photocrosslinkable composition as claimed in claim 14 onto a support, (coating step),
(ii) exposing certain areas of the layer of photocrosslinkable composition to radiation activating the photoinitiator and/or the photosensitizer and to trigger the cationic polymerization of the epoxycycloalkyl functions of the prepolymer present in said photo-crosslinkable composition (irradiation step),
(iii) removing the nonphotocrosslinked areas by immersing the support carrying the partially photocrosslinked composition in a solvent for the photocrosslinkable composition (revealing step).

16. The process as claimed in claim 15, wherein step (i) is followed by a soft bake step at a temperature between 40 and 100° C., for a period of between 2 and 30 minutes.

17. The process as claimed in claim 15, wherein the irradiation step (ii) is followed by a post-exposure bake step at a temperature of between 20° C. and 85° C. for a period of between 5 and 30 minutes.

18. The process as claimed in claim 15, wherein the revealing step (iii) is followed by a hard bake step at a temperature of between 100° C. and 130° C., for a period of between 30 and 180 minutes.

19. The process as claimed in claim 15, wherein the irradiation step is carried out with light having emission lines which have a wavelength of between 240 and 420 nm with a dose of greater than or equal to 100 mJ/cm$^2$.

20. A photocrosslinkable composition obtainable by means of a method as claimed in claim 1, said composition having a viscosity, measured at 20° C., of less than 50 centipoises.

21. A method for preparing a photocrosslinkable composition, comprising the following steps:
(a) a reaction for hydrolysis and condensation of an [(epoxycycloalkyl)alkyl]trialkoxysilane in solution in an organoaqueous medium containing water, in a water/monomer initial molar ratio of between 3 and 15, and at least one water-miscible solvent, at a pH of between 1.6 and 4.0, by heating the solution at a temperature of between 50 and 70° C. for a period of between 180 and 350 minutes, so as to obtain a solution of an organomineral hybrid prepolymer, in which all or virtually all of the alkoxysilane groups have been hydrolyzed, and which comprises on average at least 4 (epoxycycloalkyl) alkyl groups per molecule,
(b2) evaporating the solvent phase of the reaction mixture of step (a) for 120 to 300 minutes, under a reduced pressure of between 20 and 30 mbar, at a temperature of between 45° C. and 65° C., until a solids content of between 60% and 85% is obtained,
(c2) preparing, at room temperature and with stirring, a homogeneous solution of at least one photoinitiator, at least one photosensitizer in a solvent chosen from the group consisting of 1-methoxy-2-propanol, N-methylpyrrolidone (NMP), propylene glycol methyl ether acetate (PGMEA), acetone, ethanol and propylene glycol and dimethyl ether,
(d2) mixing, at room temperature, the concentrated composition obtained in step (b2) with the homogeneous solution obtained in step (c2) by stirring for a period of between 30 and 60 minutes, the mixing ratio being such that the resulting composition has a solids content of between 40% and 70% by weight,
(e) filtering the resulting composition through a filter comprising pores with an average size of between 1 μm and 5 μm, and
(f) storing the resulting liquid filtrate at a temperature below 0° C.

* * * * *